United States Patent
Takayama

(10) Patent No.: US 8,043,937 B2
(45) Date of Patent: Oct. 25, 2011

(54) METHOD FOR MANUFACTURING SEMICONDUCTOR SUBSTRATE

(75) Inventor: Toru Takayama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/730,284

(22) Filed: Mar. 24, 2010

(65) Prior Publication Data

US 2010/0248445 A1    Sep. 30, 2010

(30) Foreign Application Priority Data

Mar. 26, 2009   (JP) ................. 2009-075824

(51) Int. Cl.
   *H01L 21/762*   (2006.01)
(52) U.S. Cl. ........ 438/458; 257/E21.054; 257/E21.561; 257/E21.568; 438/459; 438/603; 438/769; 438/787; 438/931
(58) Field of Classification Search ........... 257/E21.054, 257/E21.561, E21.568; 438/458, 459, 603, 438/769, 787, 931
See application file for complete search history.

(56) References Cited

U.S. PATENT DOCUMENTS

| 4,983,538 | A | 1/1991 | Gotou |
| 5,667,586 | A * | 9/1997 | Ek et al. ................. 117/84 |
| 5,759,908 | A * | 6/1998 | Steckl et al. ............ 438/479 |
| 6,391,799 | B1 * | 5/2002 | Di Cioccio ............. 438/781 |
| 2008/0246109 | A1 | 10/2008 | Ohnuma et al. |

FOREIGN PATENT DOCUMENTS

| JP | 62-066000 | 3/1987 |
| JP | 01-135070 | 5/1989 |
| JP | 02-048495 | 2/1990 |

* cited by examiner

*Primary Examiner* — Asok Sarkar
(74) *Attorney, Agent, or Firm* — Eric J. Robinson; Robinson Intellectual Property Law Office, P.C.

(57) ABSTRACT

It is an object to provide a novel manufacturing method of a semiconductor substrate containing silicon carbide. The method for manufacturing a semiconductor device includes the steps of performing carbonization treatment on a surface of a silicon substrate to form a silicon carbide layer; adding ions to the silicon substrate to form an embrittlement region in the silicon substrate; bonding the silicon substrate and a base substrate with insulating layers interposed between the silicon substrate and the base substrate; heating the silicon substrate and separating the silicon substrate at the embrittlement region to form a stacked layer of the silicon carbide layer and a silicon layer over the base substrate with the insulating layers interposed between the base substrate and the stacked layer; and removing the silicon layer to expose a surface of the silicon carbide layer.

10 Claims, 8 Drawing Sheets

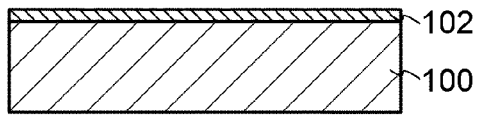
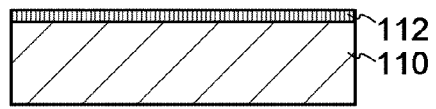
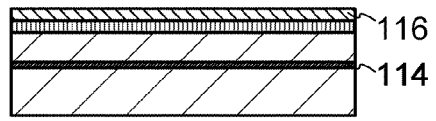
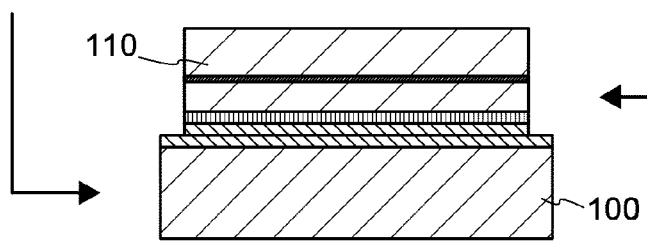
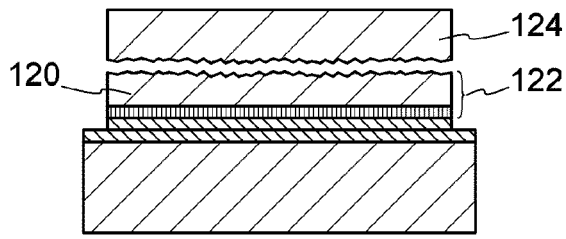
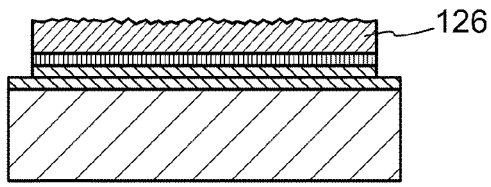
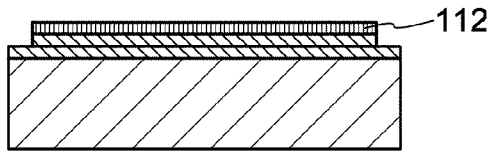

FIG. 2A
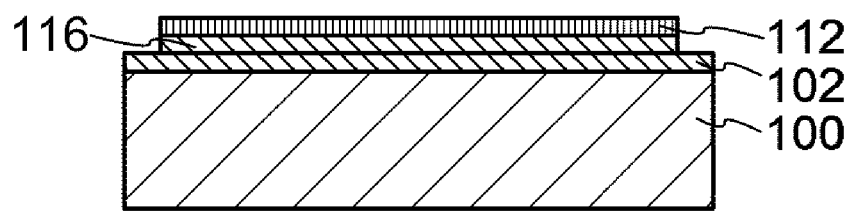
FIG. 2B
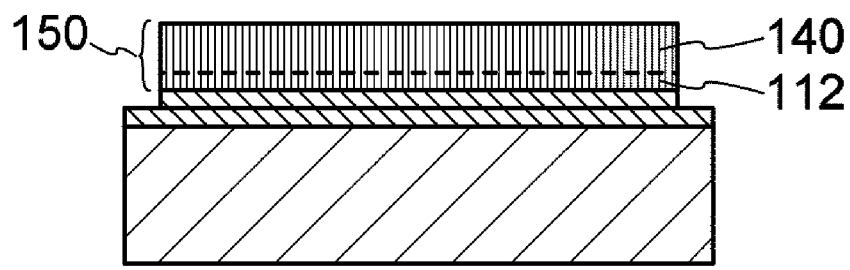

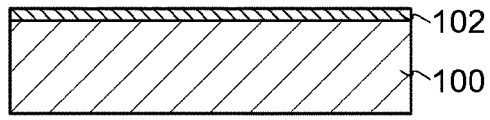
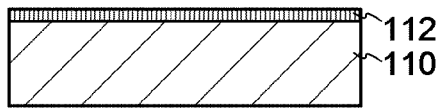
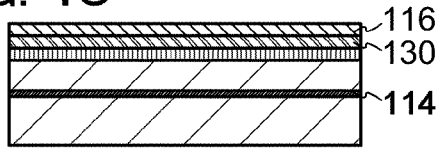
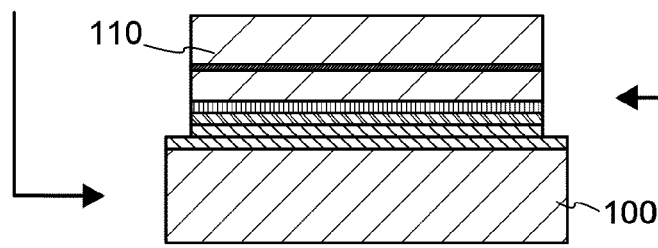
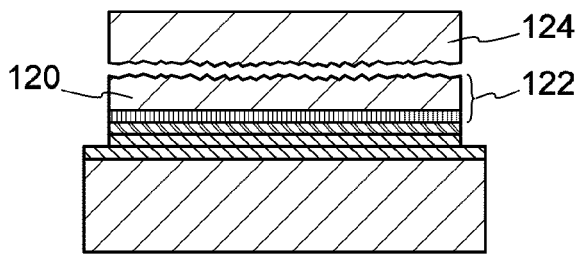
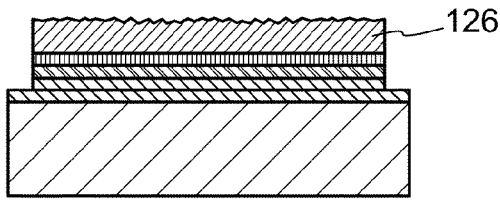
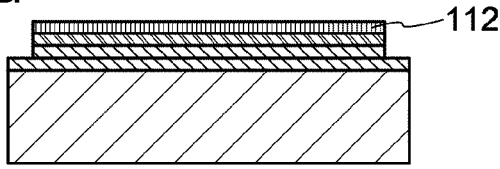

METHOD FOR MANUFACTURING SEMICONDUCTOR SUBSTRATE

BACKGROUND OF THE INVENTION

1. Field of the Invention

A technical field of the present invention relates to a method for manufacturing a semiconductor substrate.

2. Description of the Related Art

It is known that silicon carbide as a semiconductor material is more advantageous than silicon in terms of increasing the withstand voltage of a semiconductor element (for example, a transistor), reducing a loss of electric power, or the like. Therefore, it is expected that silicon carbide is used for practical application of a transistor for electric power.

The cost of a silicon carbide substrate itself is the biggest problem for realizing the semiconductor element using silicon carbide. It is difficult to melt silicon carbide because of its characteristics; therefore, the silicon carbide substrate cannot be manufactured by a Czochralski (CZ) method or the like which are used for manufacturing a silicon substrate. Therefore, a sublimation recrystallization method which is disadvantageous in terms of productivity has to be used for manufacturing a silicon carbide substrate for application of semiconductor (for example, see Patent Document 1 and Patent Document 2). The sublimation recrystallization method is a method in which a material is sublimated by heating and single-crystal silicon carbide is grown on seed crystal; therefore, there are problems in that a device in which the sublimation recrystallization method is performed at a very high temperature of 2000° C. to 3000° C. is needed and it is difficult to increase an area of the silicon carbide substrate.

Moreover, there is also a problem in that the silicon carbide substrate has defects called micropipes. The micropipes are hollow-core defects with a diameter of about 1 μm to 3 μm. If the micropipes exist in a semiconductor element, conductive defect occurs locally, and as a result, operation defect of a semiconductor element occurs. Other than the micropipes, there are also problems such as dislocation or the like.

After all, although a semiconductor element having a silicon carbide is expected to be high performance device, its commercialization is delayed in practice due to low productivity and low quality of crystals.

[Reference]

[Patent Document 1] Japanese Published Patent Application No. S62-66000

[Patent Document 2] Japanese Published Patent Application No. H2-48495

SUMMARY OF THE INVENTION

In view of the foregoing problems, an object of one embodiment of the present invention disclosed in this specification and the like (at least including claims, specification, and drawings) is to provide a novel manufacturing method of a semiconductor substrate having silicon carbide.

One embodiment of the present invention disclosed in this specification and the like is to perform carbonization treatment on a surface of a silicon substrate so as to form a silicon carbide layer and manufacture a semiconductor substrate by using the silicon carbide layer.

For example, one embodiment of the present invention disclosed in this specification and the like is a method for manufacturing a semiconductor device including the steps of performing carbonization treatment on a surface of a silicon substrate to form a silicon carbide layer; adding ions to the silicon substrate to form an embrittlement region in the silicon substrate; bonding the silicon substrate to a base substrate with insulating layers interposed therebetween; heating the silicon substrate and separating the silicon substrate at the embrittlement region to form a stacked layer structure of the silicon carbide layer and a silicon layer over the base substrate with the insulating layers interposed therebetween; and removing the silicon layer to expose a surface of the silicon carbide layer.

In addition, another embodiment of the present invention disclosed in this specification and the like is a method for manufacturing a semiconductor device including the steps of performing carbonization treatment on a surface of a silicon substrate to form a silicon carbide layer; adding ions to the silicon substrate to form an embrittlement region in the silicon substrate; bonding the silicon substrate to a base substrate with insulating layers interposed therebetween; heating the silicon substrate and separating the silicon substrate at the embrittlement region to form a stacked layer structure of the silicon carbide layer and a silicon layer over the base substrate with the insulating layers interposed therebetween; removing the silicon layer to expose a surface of the silicon carbide layer; and thickening the silicon carbide layer by an epitaxial growth method.

Moreover, in the above description, it is preferable that the silicon layer is removed after the silicon layer is oxidized.

Further, another embodiment of the present invention disclosed in this specification and the like is a method for manufacturing a semiconductor device including the steps of performing carbonization treatment on a surface of a silicon substrate to form a silicon carbide layer; adding ions to the silicon substrate to form an embrittlement region in the silicon substrate; bonding the silicon substrate to a base substrate with insulating layers interposed therebetween; heating the silicon substrate and separating the silicon substrate at the embrittlement region to form a stacked layer structure of the silicon carbide layer and a silicon layer over the base substrate with the insulating layers interposed therebetween; and oxidizing the silicon layer to form a stacked layer structure of the silicon carbide layer and a silicon oxide layer.

Note that, in the above description, it is preferable that the carbonization treatment contains any of heat treatment or laser light irradiation treatment under a carbon-containing atmosphere, heat treatment or laser light irradiation treatment after a thin film containing carbon is formed on the surface of the silicon substrate, or heat treatment or laser light irradiation treatment after liquid containing carbon is applied on the surface of the silicon substrate.

In addition, in the above description, a conductive layer may be formed on the silicon carbide layer after the silicon carbide layer is formed and before the silicon substrate and the base substrate are bonded to each other.

By using the above semiconductor substrate, various semiconductor elements and a semiconductor device including the various semiconductor elements can be manufactured.

In one embodiment of the disclosed invention, a silicon carbide layer is formed by using a silicon substrate. Accordingly, a semiconductor substrate including silicon carbide can be provided at very low cost. In addition, a silicon substrate which is to be a silicon carbide layer can be reused; therefore, manufacturing cost can be further reduced.

Moreover, since a semiconductor substrate having a silicon carbide layer over an insulating layer can be provided, characteristics of a semiconductor element can be improved by using this. That is, characteristics of a semiconductor device using the semiconductor element can be improved.

BRIEF DESCRIPTION OF THE DRAWINGS

In the accompanying drawings:

FIGS. 1A to 1G are cross-sectional views illustrating a method for manufacturing a semiconductor substrate;

FIGS. 2A and 2B are cross-sectional views illustrating a method for manufacturing a semiconductor substrate;

FIGS. 4A to 4G are cross-sectional views illustrating a method for manufacturing a semiconductor substrate;

DETAILED DESCRIPTION OF THE INVENTION

Figure 3A:
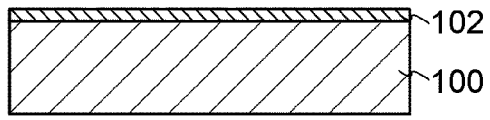
FIGS. 3A to 3G are cross-sectional views illustrating a method for manufacturing a semiconductor substrate.

Hereinafter, embodiments will be described in detail with reference to the accompanying drawings. Note that the present invention is not limited to the description of the embodiments, and it is apparent to those skilled in the art that modes and details can be modified in various ways without departing from the spirit of the present invention disclosed in this specification and the like. In addition, structures in different embodiments can be implemented by combination appropriately. In structures of the invention described below, a reference numeral indicating the same part or a similar function is used in common throughout different drawings, and the repeated description is omitted.

Embodiment 1

This embodiment describes an example of a method for manufacturing a semiconductor substrate according to one embodiment of the disclosed invention with reference to FIGS. 1A to 1G, and FIGS. 2A and 2B. First, an example of a basic method for manufacturing a semiconductor substrate will be described with reference to FIGS. 1A to 1G <Method for Manufacturing Semiconductor Substrate 1>

First, a base substrate 100 is prepared (see FIG. 1A). As the base substrate 100, although it is preferable to use a substrate with a high heat resistance, such as a quartz substrate, an alumina substrate, and a silicon substrate, a light-transmitting glass substrate used for liquid crystal display devices or the like can be used. A substrate having a strain point of greater than or equal to 580° C. (preferably greater than or equal to 600° C.) may be used as the glass substrate. In terms of the heat resistance, it is preferable to use a substrate having the strain point as high as possible. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that, as the base substrate 100, as well as the above substrate, a substrate which is formed with an insulator, such as a ceramic substrate or a sapphire substrate; a substrate which is formed with a semiconductor such as germanium or a silicon germanium; a substrate which is formed with a conductor such as stainless steel; or the like can be used.

Next, an insulating layer 102 is formed over the base substrate 100 (see FIG. 1A). A method for forming the insulating layer 102 is not particularly limited to a certain method, and for example, a sputtering method, a plasma CVD method, or the like can be used. In addition, the thermal oxidation treatment may be used for forming the insulating layer 102. The insulating layer 102 is a layer having a surface for bonding; therefore, the surface preferably has high planarity. The insulating layer 102 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, in the case where the insulating layer 102 is formed using silicon oxide, the insulating layer 102 which is extremely superior in planarity can be obtained by a chemical vapor deposition method with the use of an organosilane gas. Note that the insulating layer 102 may have a single-layer structure or a stacked layer structure.

Note that in this specification and the like, oxynitride refers to a substance that contains more oxygen (atoms) than nitrogen (atoms). For example, silicon oxynitride is a substance including oxygen, nitrogen, silicon, and hydrogen in ranges of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, nitride oxide refers to a substance that contains more nitrogen (atoms) than oxygen (atoms). For example, a silicon nitride oxide is a substance including oxygen, nitrogen, silicon, and hydrogen in ranges of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that the above ranges are obtained by measurement using Rutherford Backscattering Spectrometry (RBS) or Hydrogen Forward Scattering (HFS). Moreover, the total of the percentages of the constituent elements does not exceed 100 at. %.

Next, a silicon substrate 110 is prepared (see FIG. 1B). A single-crystal silicon substrate, a polycrystalline silicon substrate and the like are silicon substrates, and any type of silicon substrate can be used for the silicon substrate. This embodiment describes the case where the single-crystal silicon substrate is used as the silicon substrate 110. Note that a substrate formed of a material other than silicon may also be used as long as a material which combines with carbon to form carbide semiconductor is used. For example, a germanium substrate, a silicon germanium substrate, or the like may be used.

Although there is no limitation on the size of the silicon substrate 110, for example, a circular silicon substrate having a diameter of 8 inches (200 mm), 12 inches (300 mm), or 18 inches (450 nm) can be used. In addition, the circular silicon substrate may be processed into a rectangular shape for being used as the silicon substrate 110. Note that in this specification and the like, the term "single-crystal" indicates a crystal which has a regular crystal structure and crystal axes oriented in the same direction in all portions of the crystal. Note that, it is not a matter of how many defects there are.

Next, a silicon carbide layer 112 is formed on the surface of the silicon substrate 110 by carbonization treatment (see FIG. 1B). Although there are various kinds of carbonization treatment, for example, heat treatment or laser light irradiation treatment under a carbon-containing atmosphere, heat treatment or laser light irradiation treatment after a thin film containing carbon is formed on the surface of the silicon substrate, heat treatment or laser light irradiation treatment after liquid containing carbon is applied on the surface of the silicon substrate, or the like can be applied.

As the heat treatment under a carbon-containing atmosphere, for example, there is heat treatment under a mixed atmosphere of hydrogen and a hydrocarbon gas such as methane or propane. The heat treatment may be performed at temperatures of 1000° C. to 1300° C., preferably 1100° C. to 1250° C. The silicon substrate 110 is impregnated with carbon from the surface to the depth of about 20 nm by this treatment, and the silicon carbide layer 112 is formed.

As the laser light irradiation treatment under a carbon-containing atmosphere, for example, there is laser light irradiation treatment under a mixed atmosphere of hydrogen and a hydrocarbon gas such as methane or propane. In this case, it is preferable that the laser light be delivered in a manner such that at least a surface portion of the silicon substrate 110 melts. Note that in the case of performing the laser light irradiation treatment while heating the silicon substrate 110 at 500° C. to 1000° C., there is an advantage that the silicon carbide layer 112 is formed easily.

Note that the above-mentioned heat treatment can be performed using a heat treatment apparatus such as a rapid thermal anneal (RTA), a furnace, a millimeter wave heating device, or the like. As a heating method of the heat treatment apparatus, a resistance heating method, a lamp heating method, a gas heating method, a radio wave heating method, and the like can be given. The heat treatment may be performed by thermal plasma jet irradiation or the like.

In addition, a pulsed laser from which a high-energy laser light is easily obtained is preferably used for the above laser light irradiation treatment. The repetition rate is preferably about greater than or equal to 1 Hz and less than or equal to 10 MHz, more preferably greater than or equal to 10 Hz and less than or equal to 1 MHz. As the pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, or the like can be used. Note that the laser light is not limited to the pulsed laser, and a continuous-wave laser may be used. Example of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like. Note that a wavelength of the laser light is needed to be a wavelength which is absorbed into the silicon substrate 110. For example, when the silicon substrate 110 is a single-crystal silicon substrate, laser light having a wavelength of greater than or equal to 250 nm and less than or equal to 700 nm may be used.

After the silicon carbide layer 112 is formed as described above, treatment (planarization treatment) to reduce surface unevenness of the silicon carbide layer 112 may be performed. As the treatment, one of a dry etching process or a wet etching process or a combination of both of the etching processes may be performed. Alternatively, polishing treatment such as a chemical mechanical polishing (CMP) or the like may be performed. In addition, a combination of both the etching process and the polishing treatment may be performed.

A thickness of the silicon carbide layer 112 is not particularly limited, but for example, the silicon carbide layer 112 may be formed with a thickness of greater than or equal to 1 nm and less than or equal to 100 nm. In the case where a thicker silicon carbide layer is preferred, it is possible to make the silicon carbide layer thick by performing epitaxial growth method or the like. In addition, there is no particular limitation on crystallinity of the silicon carbide layer 112, and the silicon carbide layer 112 can have any of single-crystal, polycrystalline, or amorphous structures. Note that in this embodiment, a single-crystal silicon substrate is used as the silicon substrate 110 and therefore, a single-crystal silicon carbide layer can be formed as the silicon carbide layer 112.

Next, by adding ions to the silicon substrate 110 after the silicon carbide layer 112 is formed, an embrittlement region 114 is formed (see FIG. 1C). More specifically, for example, an ion beam including ions accelerated by an electric field is delivered to form the embrittlement region 114 at a predetermined depth from a surface of the silicon substrate 110 (more precisely, a surface of the silicon carbide layer 112 formed on the silicon substrate 110). The depth of the region where the embrittlement region 114 is formed is controlled by the accelerating energy of the ion beam and the incidence angle the ion beam. Note that, the embrittlement region 114 is formed in a region at a depth the same or substantially the same as the average penetration depth of the ions.

Depending on the depth at which the embrittlement region 114 is formed, the thickness of the semiconductor layer which is separated from the silicon substrate 110 is determined. The depth where the embrittlement region 114 is formed is greater than or equal to 50 nm and less than or equal to 1 μm from the surface of the silicon substrate 110, and is preferably greater than or equal to 50 nm and less than or equal to 300 nm.

At the time of adding ions to the silicon substrate 110, an ion implantation apparatus or an ion doping apparatus can be used. In the ion implantation apparatus, a source gas is excited to produce ion species, the produced ion species are mass-separated, and an object to be processed is irradiated with the ion species having a predetermined mass. In the ion doping apparatus, a process gas is excited to produce ion species, the produced ion species are not mass-separated, and an object to be processed is irradiated with the produced ion species. Note that in an ion doping apparatus provided with a mass separator, ion irradiation with mass separation can also be performed as in the ion implantation apparatus.

In the case of using the ion doping apparatus, a step of forming the embrittlement region 114 can be performed, for example, under the following conditions:

Accelerating voltage is greater than or equal to 10 kV and less than or equal to 100 kV (preferably greater than or equal to 30 kV and less than or equal to 80 kV)

Dose is greater than or equal to $1\times10^{16}/cm^2$ and less than or equal to $4\times10^{16}/cm^2$.

Beam current intensity is greater than or equal to 2 μA/cm$^2$ (preferably greater than or equal to 5 μA/cm$^2$, more preferably greater than or equal to 10 μA/cm$^2$).

In the case of using the ion doping apparatus, a gas containing hydrogen can be used as a source gas. With the gas containing hydrogen, $H^+$, $H_2^+$, and $H_3^+$ can be produced as ion species. In the case where a hydrogen gas is used as the source gas, it is preferable to perform irradiation with a larger amount of $H_3^+$ ions. Specifically, it is preferable that the ion beam contains $H_3^+$ ions at a proportion of 70% or higher with respect to the total amount of $H^+$, $H_2^+$, and $H_3^+$ ions. It is more preferable that the proportion of $H_3^+$ ions be higher than or equal to 80%. By increasing the proportion of $H_3^+$ ions in this manner, the embrittlement region 114 can contain hydrogen at a concentration of higher than or equal to $1\times10^{20}$ atoms/cm$^3$. Accordingly, separation at the embrittlement region 114 can be performed easily. By irradiation with a larger amount of $H_3^+$ ions, the embrittlement region 114 can be formed in a shorter period of times as compared to the case of irradiation with $H^+$ ions and $H_2^+$ ions. Moreover, with the use of $H_3^+$, the average penetration depth of ions can be made shallower; thus, the embrittlement region 114 can be formed at a shallower region.

In the case of using the ion implantation apparatus, it is preferable to perform irradiation with $H_3^+$ ions through mass separation. Of course, irradiation with $H^+$ ions or $H_2^+$ ions may be performed. Note that, since ion species are selected to perform irradiation in the case of using the ion implantation apparatus, ion irradiation efficiency is decreased compared to the case of using the ion doping apparatus, in some cases.

As the source gas for the ion irradiation step, as well as the gas containing hydrogen, one or more kinds of gases selected from a rare gas such as helium or argon; a halogen gas typified by a fluorine gas or a chlorine gas; or a halogen compound gas such as a fluorine compound gas (for example, $BF_3$) can be used. When helium is used for the source gas, an ion beam with high proportion of $He^+$ ions can be formed without mass separation. By using such ion beams, the embrittlement region 114 can be efficiently formed.

Further, the embrittlement region 114 can also be formed by performing the ion irradiation step plural times. In this case, either different source gases or the same source gas may be used for the ion irradiation steps. For example, ion irradiation can be performed using a gas containing hydrogen as a source gas after ion irradiation is performed using a rare gas as a source gas. Alternatively, ion irradiation may be performed first using a halogen gas or a halogen compound gas, and then, ion irradiation may be performed using the gas containing hydrogen.

Note that before the above ion irradiation step is performed, an insulating layer which functions as a protective insulating layer may be formed on the surface of the silicon substrate 110 (or the silicon carbide layer 112). Needless to say, it is also possible that the insulating layer is not provided; however, the insulating layer is preferably provided in order to prevent contamination of the silicon substrate 110 and surface damage of the silicon substrate 110 (or the silicon carbide layer 112) due to later ion irradiation. The thickness of the insulating layer is preferably greater than or equal to 10 nm and less than or equal to 400 nm. In addition, the description regarding the insulating layer may be referred to for the formation method, material, structure, and the like of the insulating layer 102. The insulating layer may be removed or may remain after the ion irradiation step.

An insulating layer 116 is formed on the silicon carbide layer 112 (see FIG. 1C). The description regarding the insulating layer 116 may be referred to for the formation method, material, structure, and the like of the insulating layer 102. In the same manner as the insulating layer 102, the insulating layer 116 is a layer having a surface for bonding; therefore, the surface preferably has high planarity. Note that the insulating layer 116 is not necessary the same as the insulating layer 102.

Note that in this embodiment, the case in which the insulating layer 102 is formed on the base substrate 100 side and the insulating layer 116 is formed on the silicon substrate 110 side is described; however, one embodiment of the disclosed invention disclosed herein is not limited thereto. For example, the insulating layer may be provided only on the base substrate 100 side or only on the silicon substrate 110 side. In addition, in the case where the surfaces for bonding are sufficiently planarized, a structure without an insulating layer may be employed.

Note that the ion irradiation step (step of forming the embrittlement region 114) may be performed before or after the insulating layer 116 is formed.

Then, the base substrate 100 and the silicon substrate 110 are bonded to each other (see FIG. 1D). Specifically, the base substrate 100 and the silicon substrate 110 are bonded to each other with the insulating layer 102 and the insulating layer 116 interposed therebetween. Note that the surfaces of the insulating layer 102 and the insulating layer 116 for bonding are preferably cleaned by an ultrasonic cleaning method or the like before the bonding. After the surface of the insulating layer 102 is in contact with the surface of the insulating layer 116, heat treatment is performed, so that the base substrate 100 and the silicon substrate 110 are bonded to each other. As bonding mechanism, mechanism relating to van der Waals' force, mechanism relating to hydrogen bonding, or the like is conceivable.

Note that the surfaces for bonding may be subjected to oxygen plasma treatment or ozone treatment before bonding so that the surface may be hydrophilic. By this treatment, a hydroxyl is added to the surfaces for bonding so that a hydrogen bond can be formed at a bonding interface.

After the bonding, heat treatment may be performed on the base substrate 100 and the silicon substrate 110 which are bonded to each other so as to strengthen the bonding. The heat temperature at this time needs to be a temperature that does not promote separation at the embrittlement region 114. For example, a temperature lower than 400° C., more preferably lower than or equal to 300° C. can be employed. There is no particular limitation on heat treatment time, and an optimal condition may be set as appropriate in accordance with a relation between heat treatment time and bonding force. For example, heat treatment can be performed at 200° C. for two hours. Note that only the region for bonding can be locally heated by irradiating the region with microwaves or the like. When there is no problem with the bonding strength of the substrates, the heat treatment may be omitted.

Next, the silicon substrate 110 is separated into a semiconductor layer 122 including a stacked layer structure of the silicon carbide layer 112 and a silicon layer 120 and a silicon substrate 124 at the embrittlement region 114 (see FIG. 1E). The silicon substrate 110 is separated by heat treatment. The temperature for the heat treatment can be set based on the upper temperature limit of the base substrate 100. For example, when a glass substrate is used as the base substrate 100, the temperature of the heat treatment is preferably equal to or greater than 400° C. and equal to or lower than the strain point of the glass substrate. Note that in this embodiment, heat treatment is performed at 600° C. for two hours.

By performing the above-described heat treatment, the volume of microvoids formed in the embrittlement region 114 is changed, and a crack is generated in the embrittlement region 114. As a result, separation of the silicon substrate 110 is caused along the embrittlement region 114. Accordingly, the semiconductor layer 122 separated from the silicon substrate 110 is left over the base substrate 100. Further, since the interface for bonding the insulating layer 102 to the insulating layer 116 is heated by this heat treatment, a covalent bond is formed at the interface for bonding, so that the bonding force between the insulating layer 102 and the insulating layer 116 can be further improved.

In the structural body (hereinafter simply referred to as a semiconductor substrate) including the base substrate 100 formed as described above, an upper portion of the semiconductor layer 122 is the silicon layer 120. Therefore, treatment for removing the silicon layer 120 is performed.

In this embodiment, oxidation treatment is performed on the silicon layer 120 to form a silicon oxide layer 126 (see FIG. 1F), and the silicon oxide layer 126 is removed, whereby the silicon carbide layer 112 is left on the base substrate 100

(see FIG. 1G). By oxidation of the silicon layer 120, selection ratio between the silicon layer 120 and the silicon carbide layer 112 can be high; therefore, the silicon layer 120 can be removed very easily. Note that the thickness of the silicon layer 120 is preferably less than or equal to 300 nm, more preferably less than or equal to 200 nm to perform oxidation and removing efficiently. Thus, oxidation and removing of the silicon layer 120 can be realized since the thickness of the silicon layer 120 is thin. Therefore, it can be said that this technique is especially effective in the case of forming the semiconductor layer 122 by using separation due to addition of ions.

As oxidation treatment of the silicon layer 120, a dry oxidation method, a pyrogenic oxidation method (a wet oxidation method) in which water vapor and oxygen are used for oxidation, an HCl oxidation method in which hydrogen chloride is mixed with oxygen, or the like can be employed. In addition, an oxidation method using oxygen plasma and ozone may be used.

In order to remove the silicon oxide layer 126, one of dry etching treatment or wet etching treatment or a combination of both of the etching treatment may be performed. For example, when dry etching using an inert gas such as helium, argon, or xenon is performed, a silicon oxide layer can be selectively removed, which is preferable. Further, for example, wet etching using etchant (etching solution) such as buffered fluoric acid or other hydrofluoric acid based etchant is also preferable since a silicon oxide layer can be selectively removed.

Note that in this embodiment, a method for oxidation of the silicon layer 120 and removing thereof is described; however, one embodiment of the disclosed invention is not limited thereto. The intrinsic effect of technique according to one embodiment of the disclosed invention is remaining the silicon carbide layer 112 preferably; therefore, an oxidation method is not necessarily limited to the above as long as this can be realized. For example, etching selection ratio may be higher by performing nitridation treatment on the silicon layer 120.

Further, a silicon oxide layer may be removed by the CMP method or the like. Even in this case, the silicon oxide layer can be selectively removed by appropriately selecting the kind of slurry. Note that as the slurry, silica slurry, cerium oxide slurry and the like may be used.

After the silicon layer 120 is removed as described above, treatment (planarization treatment) to reduce surface unevenness of the silicon carbide layer 112 may be performed. As the treatment, one of a dry etching process or a wet etching process or a combination of both of the etching processes may be performed. Alternatively, polishing treatment such as CMP or the like may be performed. In addition, a combination of both the etching process and the polishing treatment may be performed. Note that etching treatment for removing the silicon oxide layer 126 may have a planarization effect on the silicon carbide layer 112.

In the foregoing manner, a semiconductor substrate including the silicon carbide layer 112 over the base substrate 100 can be manufactured (see FIG. 1G).

As described above, in this embodiment, a silicon carbide layer is formed by using a silicon substrate. Accordingly, a semiconductor substrate including silicon carbide can be provided at very low cost. In addition, a silicon substrate which is to be a silicon carbide layer can be reused; therefore, manufacturing cost can be further reduced. Moreover, since a semiconductor substrate having a silicon carbide layer over an insulating layer can be provided, characteristics of the semiconductor element can be improved by using this.

<Thickening Treatment of Silicon Carbide Layer>

Note that the silicon carbide layer 112 formed by the above method has a comparatively small film thickness (for example, less than or equal to 100 nm) because of manufacturing method thereof. Therefore, thickening treatment of a silicon carbide layer may be performed after the above step. Hereinafter, thickening treatment of a silicon carbide layer is described with reference to FIGS. 2A and 2B. Needless to say, the thickening treatment may be omitted if unnecessary.

As the thickening treatment of a silicon carbide layer, for example, an epitaxial growth method can be used. Typically, there is a vapor deposition method, a solid phase growth method, or the like as the epitaxial growth method, and any of those can be used. Here, the case of thickening a silicon carbide layer by using a vapor deposition method will be described.

First, by using the manufacturing method shown in FIGS. 1A to 1G, and the like, a semiconductor substrate including the silicon carbide layer 112 over the base substrate 100 is formed (see FIG. 2A). Planarization treatment may be performed on the silicon carbide layer 112.

Next, a silicon carbide layer 140 is formed on the silicon carbide layer 112 (see FIG. 2B). The silicon carbide layer 140 can be formed by using a CVD method or the like. In the case of forming a single-crystal silicon carbide layer by a vapor deposition method, it is preferably performed under a temperature condition of higher than or equal to 1000° C., more preferably higher than or equal to 1200° C. By the vapor deposition method, the silicon carbide layer 140 having crystallinity corresponding to the silicon carbide layer 112 is obtained.

Note that it is preferable to remove a natural oxide film and the like formed on the surface of the silicon carbide layer 112 before the silicon carbide layer 140 is formed on the silicon carbide layer 112. This is because when an oxide film or the like exists on the surface of the silicon carbide layer 112, the silicon carbide layer 140 having crystallinity corresponding to the silicon carbide layer 112 cannot be formed and crystallinity of the silicon carbide layer 140 might be reduced. Here, the above oxide film can be removed using a solution containing fluorinated acid or the like.

In the foregoing manner, a semiconductor substrate having a silicon carbide layer 150 including a stacked layer structure of the silicon carbide layer 112 and the silicon carbide layer 140 can be manufactured. After formation of the silicon carbide layer 150, planarization treatment may be performed on the silicon carbide layer 150.

Here, a method for thicken a silicon carbide layer by using a vapor deposition method is described; however, the silicon carbide layer may also be thicken by a solid phase growth method. In this case, after a silicon carbide layer having lower crystallinity than the silicon carbide layer 112 is formed on the silicon carbide layer 112, heat treatment is performed, so that the silicon carbide layer is subjected to solid phase growth. By the solid phase growth method, crystallinity of the silicon carbide layer 140 corresponds to crystallinity of the silicon carbide layer 112.

The above heat treatment is preferably performed under a saturated SiC vapor pressure and at a temperature of greater than or equal to 1900° C. Note that in the case of thicken the silicon carbide layer by the solid phase growth, the base substrate 100, the insulating layer 102, the insulating layer 116, and the like need to resist heat treatment for the solid phase growth. As a material satisfying such a condition, a metal compound such as an aluminum oxide can be given.

By thickening the silicon carbide layer as described above, application range of the semiconductor substrate can be increased. According to one embodiment of the disclosed invention, a semiconductor substrate, which includes a silicon carbide layer and can be used for various purposes, can be provided at low cost.

Embodiment 2

This embodiment describes another example of a method for manufacturing a semiconductor substrate according to one embodiment of the disclosed invention with reference to FIGS. 3A to 3G Note that there are many common points between the method for manufacturing a semiconductor substrate in this embodiment and the method for manufacturing a semiconductor substrate, according to the aforementioned embodiment. Therefore, in this embodiment, a method for manufacturing a semiconductor substrate which is different from the method according to the aforementioned embodiment will be described.

First, a base substrate 100 is prepared and an insulating layer 102 is formed on the base substrate 100 (see FIG. 3A). The aforementioned embodiment can be referred to for a detailed description thereof.

Figure 3B:
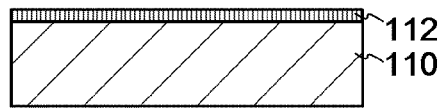
Figure 3C:
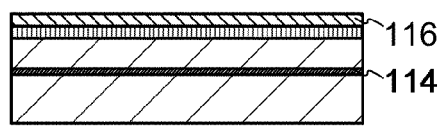
Figure 3D:
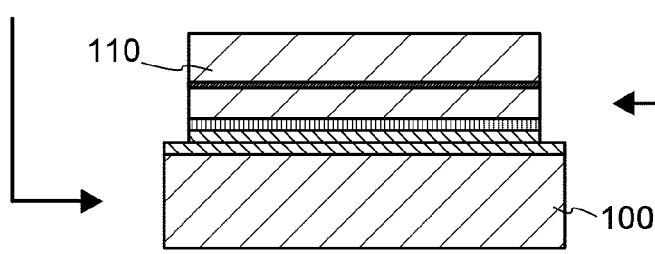

Next, a silicon substrate 110 is prepared and carbonization treatment is performed on the surface of the silicon substrate 110 to form a silicon carbide layer 112 (see FIG. 3B). Then, by adding ions to the silicon substrate 110 after the silicon carbide layer 112 is formed, an embrittlement region 114 is formed, and an insulating layer 116 is formed on the silicon carbide layer 112 (see FIG. 3C). The aforementioned embodiment can be referred to for a detailed description thereof.

Note that in this embodiment, the case in which the insulating layer 102 is formed on the base substrate 100 side and the insulating layer 116 is formed on the silicon substrate 110 side is described; however, it is the same as the aforementioned embodiment that one embodiment of the disclosed invention disclosed herein is not limited thereto.

Figure 3E:
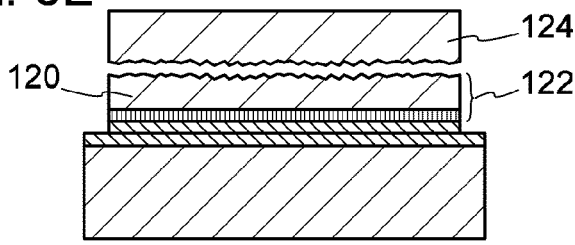
Figure 3F:
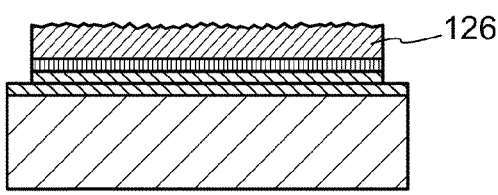
Figure 3G:
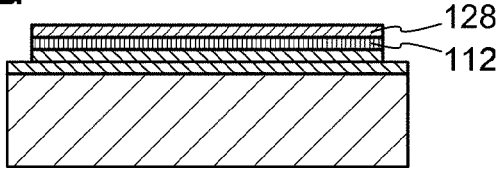

Then, the base substrate 100 and the silicon substrate 110 are bonded to each other (see FIG. 3D), and the silicon substrate 110 is separated at the embrittlement region 114 (see FIG. 3E). The aforementioned embodiment also can be referred to for the detail of the step.

Then, treatment for removing the silicon layer 120 is performed over the semiconductor substrate formed as described above. Specifically, oxidation treatment is performed on the silicon layer 120 to form a silicon oxide layer 126 (see FIG. 3F), and part of the silicon oxide layer 126 is removed, whereby a stacked layer structure of the silicon carbide layer 112 and a silicon oxide layer 128 is formed on the base substrate 100 (see FIG. 3G).

One difference between the method for manufacturing the semiconductor substrate according to this embodiment and the method for manufacturing the semiconductor substrate according to aforementioned embodiment is a method for removing the silicon oxide layer 126. That is, while the silicon oxide layer 126 is completely removed to expose the silicon carbide layer 112 in the method for manufacturing the semiconductor substrate according to aforementioned embodiment, part of the silicon oxide layer 126 is removed to leave the silicon oxide layer 128 in the method for manufacturing the semiconductor substrate according to this embodiment.

In this manner, by leaving the silicon oxide layer 128 over the silicon carbide layer 112, the silicon oxide layer 128 can be used as part of a semiconductor element. As an example of application of the silicon oxide layer 128, a gate insulating layer of a transistor can be given. In the case of using the silicon oxide layer 128 as the gate insulating layer of the transistor, it is possible to form the silicon carbide layer 112 which functions as an active layer of the transistor and the silicon oxide layer 128 which functions as a gate insulating layer in an integrated manner; therefore, defects and the like are not easily generated at an interface between the silicon carbide layer 112 and the silicon oxide layer 128. Accordingly, a transistor having excellent characteristics can be manufactured.

Note that in this embodiment, a step in which part of the silicon oxide layer 126 is removed after oxidation of the silicon layer 120 to form the silicon oxide layer 128 is described; however, one embodiment of the disclosed invention is not limited thereto. Alternatively, after the silicon layer 120 is thinned by removing part thereof, oxidation treatment may be performed on the thinned silicon layer 120 to form the silicon oxide layer 128. In addition, the thickness of the silicon oxide layer 128 may be set as appropriate in accordance with required characteristics of a semiconductor element.

The aforementioned embodiment can be referred to for a detailed description of oxidation treatment of the silicon layer 120 and treatment for removing the silicon oxide layer 126.

As described above, in this embodiment, a silicon carbide layer is formed by using a silicon substrate. Accordingly, a semiconductor substrate including silicon carbide can be provided at very low cost. In addition, a silicon substrate which is to be a silicon carbide layer can be reused; therefore, manufacturing cost can be further reduced. Moreover, since a semiconductor substrate having a silicon carbide layer over an insulating layer can be provided, characteristics of the semiconductor element can be improved by using this.

In addition, by leaving the silicon oxide layer and using that as part of a semiconductor element, the manufacturing step of the semiconductor element can be simplified. Further, by forming a stacked layer structure of the silicon carbide layer and a silicon oxide layer in this manner, defects generated at an interface between the silicon carbide layer and the silicon oxide layer can be significantly reduced.

This embodiment can be implemented in combination with the aforementioned embodiment, as appropriate.

Embodiment 3

This embodiment describes another example of a method for manufacturing a semiconductor substrate according to one embodiment of the disclosed invention with reference to FIGS. 4A to 4G Note that there are many common points between the method for manufacturing a semiconductor substrate in this embodiment and the method for manufacturing a semiconductor substrate according to the aforementioned embodiment. Therefore, in this embodiment, a method for manufacturing a semiconductor substrate which is different from the method according to the aforementioned embodiment will be described in detail.

First, a base substrate 100 is prepared and an insulating layer 102 is formed on the base substrate 100 (see FIG. 4A). The aforementioned embodiment can be referred to for a detailed description thereof.

Next, a silicon substrate 110 is prepared and carbonization treatment is performed on the surface of the silicon substrate 110 to form a silicon carbide layer 112 (see FIG. 4B). Then, by adding ions to the silicon substrate 110 after the silicon carbide layer 112 is formed, an embrittlement region 114 is formed, and a conductive layer 130 and an insulating layer 116 are formed on the silicon carbide layer 112 (see FIG. 4C).

A method for forming the conductive layer 130 is not particularly limited to a certain method, and for example, a sputtering method, a vacuum evaporation method, or the like can be used. The conductive layer 130 can be formed using a metal selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), niobium (Nb), chromium (Cr), and cerium (Ce); an alloy containing any of these metals as its main component; or nitride containing any of these metals as a component. The conductive layer 130 may be formed using conductive oxide such as indium tin oxide (ITO), indium tin oxide containing silicon oxide (ITSO), zinc oxide (ZnO); silicon to which an impurity element imparting conductivity is added; or the like. Note that the conductive layer 130 may have a single-layer structure or a stacked layer structure.

The aforementioned embodiment can be referred to for a detailed description of other structure.

Note that in this embodiment, the case the conductive layer 130 is formed on the silicon carbide layer 112 is described; however, one embodiment of the disclosed invention is not limited thereto. Various kinds of layers can be formed as well as a conductive layer. For example, a semiconductor layer to which an impurity element imparting one conductivity type is added may be formed and a semiconductor layer made from a material different from that may be formed. Alternatively, a plurality of those layers may be stacked.

Note that in this embodiment, the case in which the insulating layer 102 is formed on the base substrate 100 side and the insulating layer 116 is formed on the silicon substrate 110 side is described; however, it is the same as the aforementioned embodiment that one embodiment of the disclosed invention is not limited thereto.

Then, the base substrate 100 and the silicon substrate 110 are bonded to each other (see FIG. 4D), and the silicon substrate 110 is separated at the embrittlement region 114 (see FIG. 4E). The aforementioned embodiment also can be referred to for the detail of the step.

Then, treatment for removing the silicon layer 120 is performed over the semiconductor substrate formed as described above. Specifically, oxidation treatment is performed on the silicon layer 120 to form a silicon oxide layer 126 (see FIG. 4F), and the silicon oxide layer 126 is removed, whereby the silicon carbide layer 112 is left on the base substrate 100 (see FIG. 4G). The aforementioned embodiment can be referred to for a detailed description thereof. Note that the thickness of the silicon carbide layer may be increased after the silicon oxide layer 126 is removed.

Through the above steps, a semiconductor substrate having a structure in which a conductive layer and a silicon carbide layer are formed over a base substrate with insulating layers interposed therebetween. Note that in this embodiment, an example in which the conductive layer 130 is formed on the silicon substrate 110 side is described; however, one embodiment of the disclosed invention is not construed as being limited thereto. The conductive layer 130 and the like can be formed on the base substrate 100 side.

As described above, in this embodiment, a silicon carbide layer is formed by using a silicon substrate. Accordingly, a semiconductor substrate including silicon carbide can be provided at very low cost. In addition, a silicon substrate which is to be a silicon carbide layer can be reused; therefore, manufacturing cost can be further reduced.

In addition, by forming various kinds of layers below a silicon carbide layer, various kinds of semiconductor elements can be realized. For example, by forming a conductive layer below a silicon carbide layer, a semiconductor element having a lower electrode can be formed. In this manner, application of the semiconductor substrate is expanded by forming various kinds of layer below a silicon carbide layer. That is, according to one embodiment of the disclosed invention, a semiconductor substrate, which includes a silicon carbide layer and can be used for various purposes, can be provided at low cost.

This embodiment can be implemented in combination with any of the aforementioned embodiments, as appropriate.

Embodiment 4

This embodiment describes a method for manufacturing a semiconductor device using a semiconductor substrate manufactured by a method described in aforementioned embodiments with reference to FIGS. 5A to 5D and FIGS. 6A to 6D. More specifically, a method for manufacturing a semiconductor element used for a semiconductor device will be described. In particular, this embodiment describes a case of manufacturing an n-channel FET and a p-channel FET which are used for a CMOS circuit; however, a semiconductor element and a semiconductor device using the semiconductor element manufactured by using the semiconductor substrate is not particularly limited thereto.

Figure 5A:
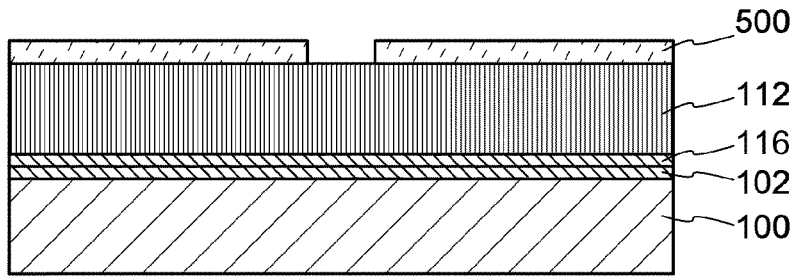
FIGS. 5A to 5D are cross-sectional views illustrating a method for manufacturing a semiconductor device.
Figure 5B:
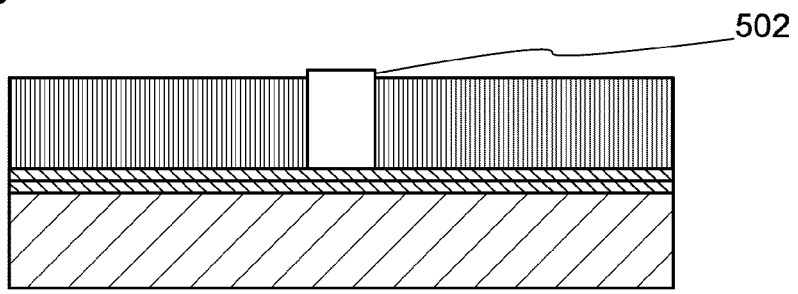

First, after the semiconductor substrate is obtained in accordance with a method described in aforementioned embodiments or the like, a protective layer 500 which functions as a mask for formation of an element isolation insulating layer is formed over a silicon carbide layer 112 (see FIG. 5A). A silicon oxide layer, a silicon nitride layer, or the like is used as the protective layer 500. Note that the semiconductor substrate used in this embodiment is equivalent to that manufactured in accordance with the aforementioned embodiments. A thickness of the silicon carbide layer 112 may be increased and planarization treatment may be performed on the surface thereof.

To control threshold voltages of the silicon carbide layer 112, a p-type impurity such as boron, aluminum, or gallium or an n-type impurity such as phosphorus or arsenic may be added to the silicon carbide layer 112.

Next, etching is performed using the protective layer 500 as a mask and exposed part of the silicon carbide layer 112 is removed. After that, an insulating layer is deposited. The insulating layer can be a silicon oxide layer, for example. The insulating layer may be formed by using any of a variety of film deposition techniques typified by a CVD method or a sputtering method. Here, the insulating layer is deposited thickly so as to be embedded in the silicon carbide layer 112.

Next, an insulating layer overlapping with the silicon carbide layer 112 is removed by polishing, etching, or the like. Then, the protective layer 500 is removed and an element isolation insulating layer 502 formed of part of the insulating layer is left (see FIG. 5B). Note that a structure in which the element isolation insulating layer 502 is provided is employed in this embodiment; however, a structure in which the element isolation insulating layer 502 is not provided may be employed.

Figure 5C:
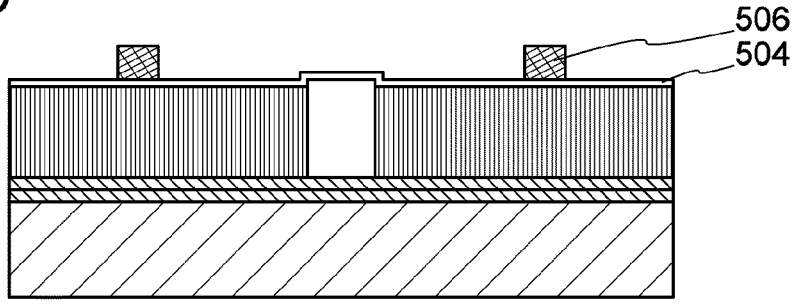
Figure 5D:
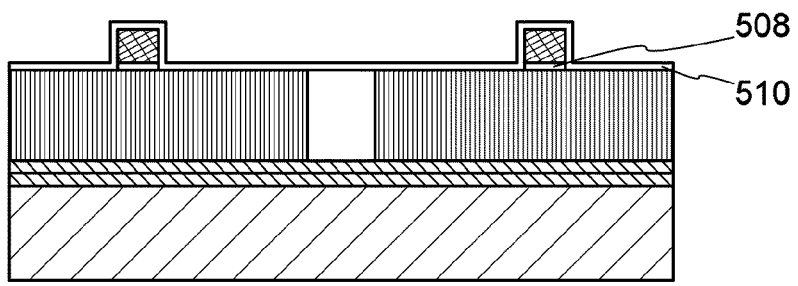

Next, an insulating layer 504 functioning as a gate insulating layer is formed and an gate electrode 506 is formed on the insulating layer 504 (see FIG. 5C). The insulating layer 504 can be formed by a CVD method, a sputtering method or the like. It is preferable that the insulating layer 504 be formed using silicon oxide, silicon nitride oxide, silicon nitride, hafnium oxide, aluminum oxide, tantalum oxide, or the like. Note that the insulating layer 504 may have a single-layer structure or a stacked layer structure. Here, a silicon oxide layer which covers a surface of the silicon carbide layer 112 is formed to have a single-layer structure by a CVD method.

A material having high heat resistance is preferably used for the gate electrode 506. For example, titanium, molybdenum, tungsten, tantalum, chromium, or nickel can be used. In addition, the gate electrode 506 may be formed using a material having low resistance, such as aluminum and copper. Further, a semiconductor material (for example, polysilicon) to which an impurity element imparting one conductivity type is added may be used.

Note that in this embodiment, the gate electrode 506 employs a single-layer structure; however, a stacked layer structure may also be used. Further, combination of the aforementioned materials may be used. In this case, combination of a material having high heat resistance and a material having low resistance, for example, a stacked layer structure of titanium and aluminum, a stacked layer structure of tungsten and aluminum, or the like may be used. Further, a stacked layer structure of the aforementioned metal material and nitride of the metal material may be employed. For example, a stacked layer structure of a titanium nitride layer and a titanium layer, a stacked layer structure of a tantalum nitride layer and a tantalum layer, a stacked layer structure of a tungsten nitride layer and a tungsten layer, and the like can be used. Note that the gate electrode 506 is formed using an evaporation method, a sputtering method, or the like.

Next, the insulating layer 504 is etched using the gate electrode 506 as a mask to form a gate insulating layer 508. In this etching, part of the element isolation insulating layer 502 is etched. After that, an insulating layer 510 covering the gate electrode 506 is formed (see FIG. 5D).

Figure 6A:
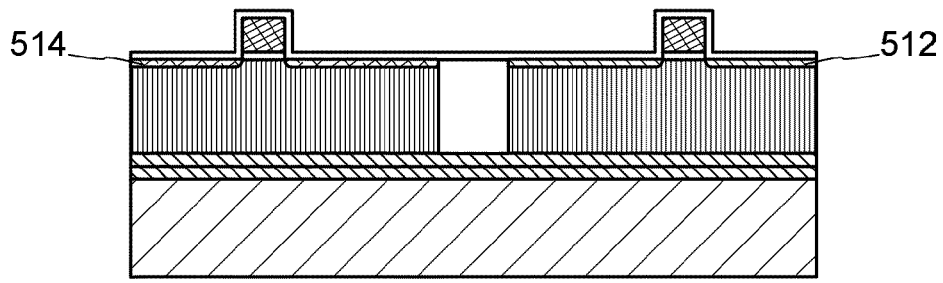
FIGS. 6A to 6D are cross-sectional views illustrating a method for manufacturing a semiconductor device.

Next, part of a region which is to be an n-channel FET later is doped with phosphorus (P), arsenic (As), or the like at a low concentration to form a first impurity region 512, and part of a region which is to be a p-channel FET later is doped with boron (B) or the like at a low concentration to form a second impurity region 514 (see FIG. 6A). Note that although the impurity regions are formed after formation of the insulating layer 510 here, the impurity regions may be formed before the insulating layer 510 is formed.

Figure 6B:
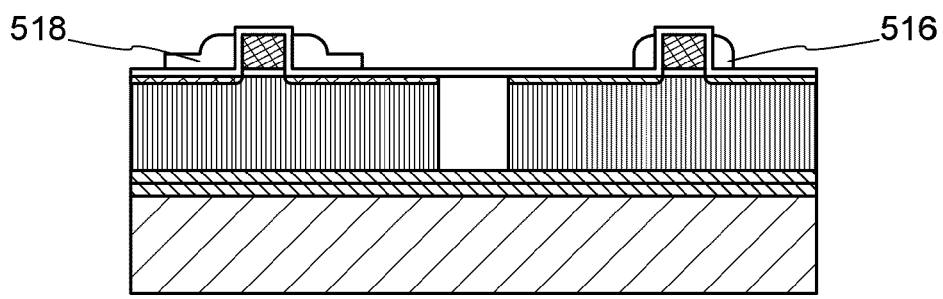
Figure 6C:
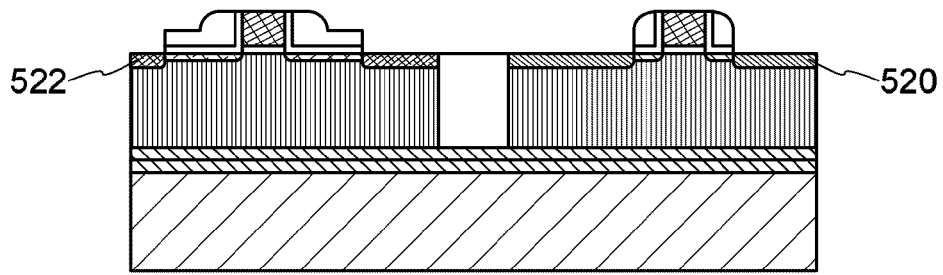
Figure 6D:
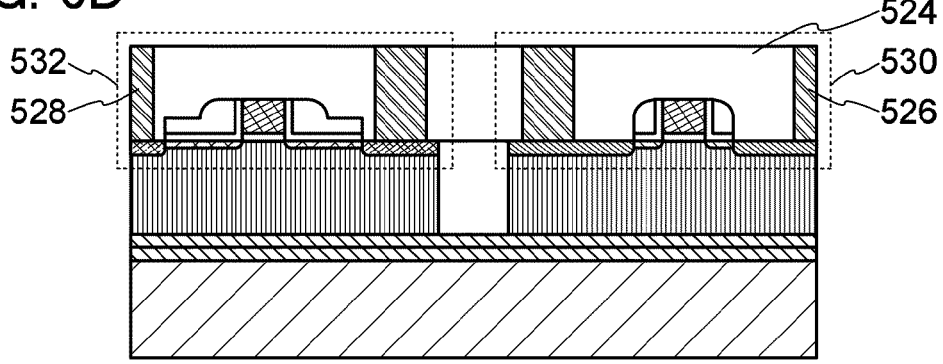

After that, a sidewall insulating layer 516 and a sidewall insulating layer 518 are formed (see FIG. 6B). The sidewall insulating layer 518 of the region which is to be the p-channel FET is preferably larger in width (the length in a channel length direction) than the sidewall insulating layer 516 of the region which is to be the n-channel FET.

Next, the insulating layer 510 is partly etched to expose a surface of the first impurity region 512 and a surface of the second impurity region 514. At this time, a top surface of the gate electrode 506 is also exposed. Then, the region which is to be the n-channel FET is doped with phosphorus (P), arsenic (As), or the like at a high concentration to form a third impurity region 520, and the region which is to be the p-channel FET is doped with boron (B) or the like at a high concentration to form a fourth impurity region 522 (see FIG. 6C). Note that although the impurity regions are formed after the insulating layer 510 is partly etched here, the impurity regions may be formed before the insulating layer 510 is etched.

Next, an interlayer insulating layer 524 is formed and a contact plug 526 and a contact plug 528 which reach the third impurity region 520 and the fourth impurity region 522, respectively, are formed. As described above, an n-channel FET 530 and a p-channel FET 532 can be manufactured using the silicon carbide layer 112 formed over the base substrate 100 (see FIG. 6D).

The n-channel FET 530 and the p-channel FET 532 can be complementarily combined to form a CMOS circuit. Further, a variety of semiconductor devices can be manufactured by using such a semiconductor element.

As described in this embodiment, increasing the withstand voltage of a semiconductor element, reducing a loss of electric power, and the like are realized by using the silicon carbide as an active layer of a FET. According to one embodiment of the disclosed invention, a semiconductor substrate including silicon carbide can be provided at very low cost; therefore, manufacturing cost of a semiconductor element and a semiconductor device can be reduced.

This embodiment can be implemented in combination with any of the aforementioned embodiments, as appropriate.

Embodiment 5

This embodiment describes a method for manufacturing a semiconductor device using a semiconductor substrate manufactured by a method described in aforementioned embodiments with reference to FIGS. 7A to 7D and FIGS. 8A to 8B. In particular, this embodiment describes a case of manufacturing a semiconductor device having a so-called power MOSFET (MOSFET for electric power) as a semiconductor element; however, a semiconductor element and a semiconductor device manufactured by using the semiconductor substrate is not particularly limited thereto.

Figure 7A:
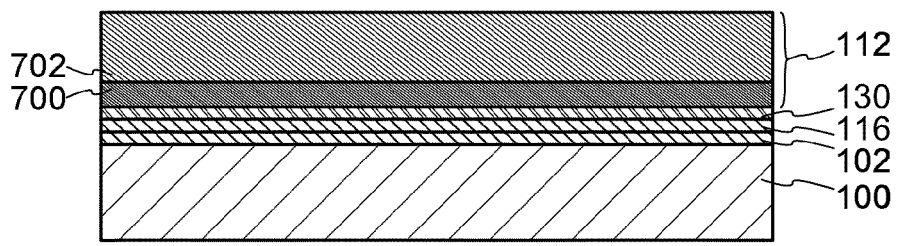
FIGS. 7A to 7D are cross-sectional views illustrating a method for manufacturing a semiconductor device.

First, a semiconductor substrate manufactured by the method described in aforementioned embodiment is prepared (see FIG. 7A). The semiconductor substrate has a structure in which an insulating layer 102, an insulating layer 116, a conductive layer 130, and a silicon carbide layer 112 are successively stacked over a base substrate 100. In addition, an impurity element imparting one conductivity type is added to the silicon carbide layer 112 and the silicon carbide layer 112 is divided into two regions according to a concentration of the impurity element. Here, a first impurity region 700 in contact with the conductive layer 130 is a region to which an impurity element is added at high concentration, and a second impurity region 702 in contact with the first impurity region 700 is a region to which an impurity element is added at low concentration.

As an impurity element which can be added to the silicon carbide layer 112, phosphorus (P) and arsenic (As) which impart n-type conductivity, and boron (B) which impart p-type conductivity can be given. The case in which phosphorus (P) is added to the first impurity region and the second impurity region to impart n-type conductivity will be described in this embodiment.

Note that this embodiment employs a structure in which the conductive layer 130 is provided below a bottom surface of the silicon carbide layer 112; however, one embodiment of the disclosed invention is not limited thereto and may employ a structure in which the conductive layer 130 may be provided selectively. In addition, a thickness of the silicon carbide layer 112 may be increased and planarization treatment may be performed on the surface thereof. In the power MOSFET described in this embodiment, the conductive layer 130 functions as a drain electrode (or a source electrode). Further, the first impurity region 700 functions as a drain region (or a source region).

Figure 7B:
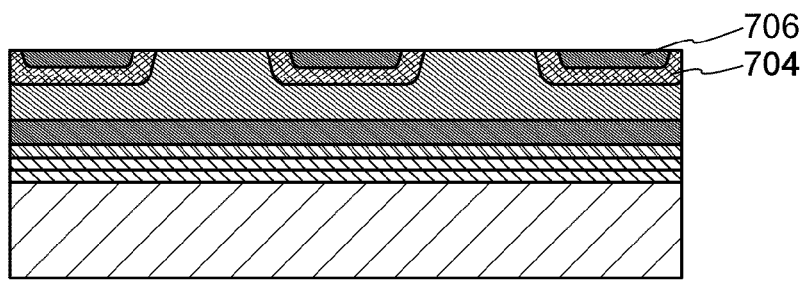
Figure 7C:
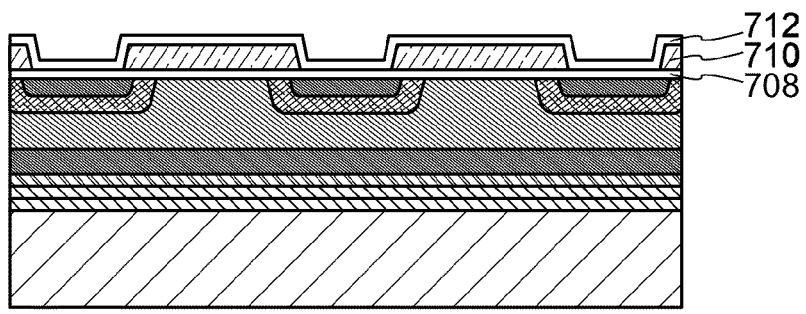

Next, an impurity element imparting p-type conductivity (for example, boron) and an impurity element imparting n-type conductivity (for example, phosphorus) are selectively added to the second impurity region 702, thereby forming a region 706 having a conductivity type different from that of the second impurity region 702 and a region 704 having the same conductivity type as that of the second impurity region 702 (see FIG. 7B). Here, part of the region 704 functions as a channel formation region later and the region 706 functions as a source region (or a drain region). In addition, an impurity concentration of the region 706 is higher than that of the second impurity region 702.

After formation of the region 704 and the region 706, an insulating layer 708 functioning as a gate insulating layer is formed over the second impurity region 702, and a conductive layer 710 functioning as a gate electrode is selectively formed over the insulating layer 708. Then, an insulating layer 712 is formed covering the conductive layer 710 (see FIG. 7C). Here, it is preferable that the conductive layer 710 be formed so that at least part of the conductive layer 710 overlaps with the region 706. Thus, the concentration of electric field is alleviated, whereby higher withstand voltage of MOSFET can be obtained.

The insulating layer 708 can be formed using silicon oxide, silicon nitride, silicon oxynitride, silicon nitride oxide, hafnium oxide, aluminum oxide, tantalum oxide, or the like. As examples of a manufacturing method, a thermal oxidation method (a thermal nitridation method), a plasma CVD method, a sputtering method, oxidation or nitridation by high density plasma treatment, and the like can be given. Although the insulating layer 712 can be formed in a manner similar to the insulating layer 708, a material different from that of the insulating layer 708 may be used for the insulating layer 712. For example, the insulating layer 712 can be formed by using organic material.

A material having high heat resistance is preferably used for the conductive layer 710. For example, titanium, molybdenum, tungsten, tantalum, chromium, or nickel can be used. In addition, the conductive layer 710 may be formed using a material having low resistance, such as aluminum and copper. Further, a semiconductor material (for example, polysilicon) to which an impurity element imparting one conductivity type is added may be used.

Note that in this embodiment, the case in which the insulating layer 708 is formed after the region 704 and the region 706 are formed is described; however, one embodiment of the disclosed invention is not construed as being limited thereto. For example, the region 704 and the region 706 may be formed after the insulating layer 708 is formed. Alternatively, an insulating layer which is to be the insulating layer 708 may be formed in manufacturing steps of the semiconductor substrate (see FIGS. 3A to 3G).

Figure 7D:
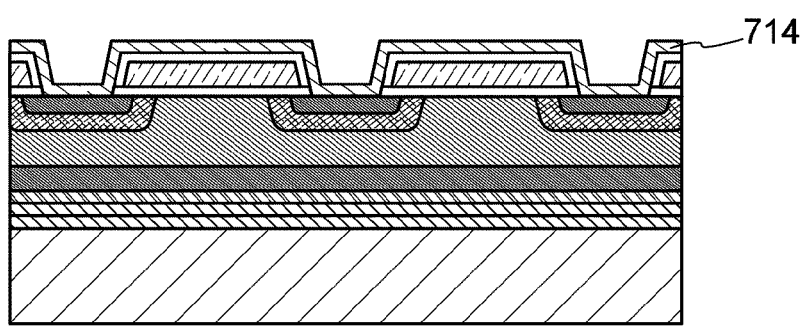

Next, after openings are formed in the insulating layer 712 and the insulating layer 708, a conductive layer 714 which is electrically connected to the region 706 is formed (see FIG. 7D). Note that the conductive layer 714 functions as a source region (or a drain region).

The openings in the insulating layer 712 and the insulating layer 708 can be formed by selective etching with the use of a resist mask or the like. In addition, the conductive layer 714 may be formed in a manner similar to the conductive layer 130 and the conductive layer 710.

Figure 8A:
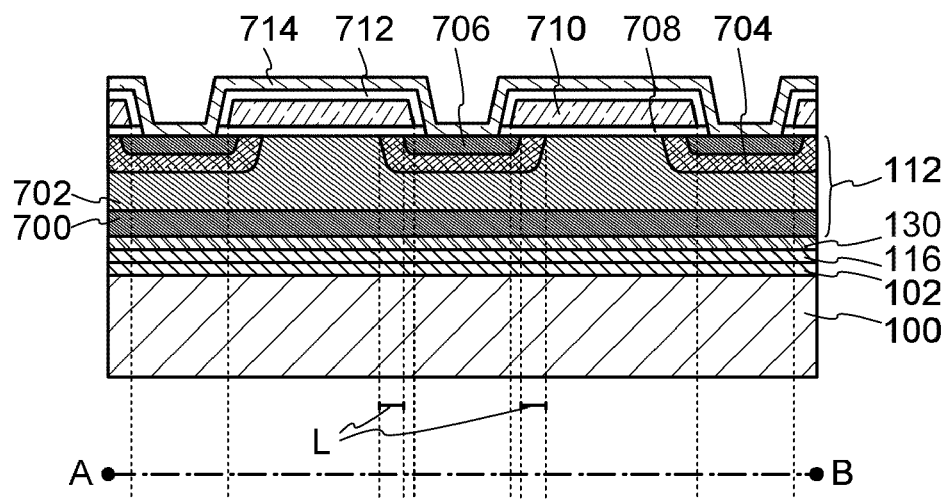
FIGS. 8A and 8B are a cross-sectional view and a plane view illustrating a semiconductor device, respectively.
Figure 8B:
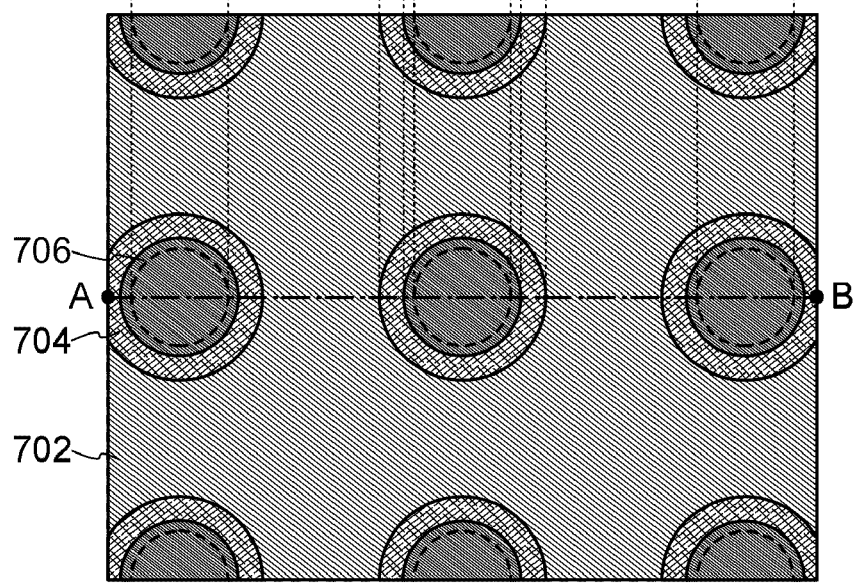

In this manner, a so-called power MOSFET can be manufactured. FIGS. 8A and 8B illustrate a cross sectional view and a plane view of the power MOSFET in this embodiment. FIGS. 8A and 8B are the cross sectional view and the plane view of the power MOSFET in this embodiment, respectively. Here, FIG. 8A corresponds to a cross section taken along a line A-B in FIG. 8B. In FIG. 8B, part of structures of the insulating layer 708, the conductive layer 710, the insulating layer 712, and the conductive layer 714 are omitted for simplicity.

Note that positions or connections of the layers are not limited to the structure illustrated in FIGS. 8A and 8B. For example, it is possible that part of the conductive layer 710 and the conductive layer 130 are electrically connected to each other, whereby the part of the conductive layer 710 can function as a wiring for the conductive layer 130.

Note that, the planar shape of the region 704 and the region 706 is a circular shape (see FIG. 8B) in this embodiment; however, an embodiment of the disclosed invention is not limited thereto. Either a rectangular shape or any other shape can be employed. The region 704 and the region 706 are circular as described in this embodiment, whereby the channel length L can be uniform. Accordingly, the concentration of the electric field in the channel formation region can be alleviated, whereby the transistor can have higher withstand voltage. Further, the conductive layer 130 has an effect of improving efficiency in waste heat of a transistor with large current.

As described in this embodiment, increasing the withstand voltage of a semiconductor element, reducing a loss of electric power, and the like are realized by using the silicon carbide as an active layer of a power MOSFET. That is, characteristics of the semiconductor device having the power MOSFET can be improved. According to one embodiment of the disclosed invention, a semiconductor substrate including silicon carbide can be provided at very low cost; therefore, manufacturing cost of a semiconductor element and a semiconductor device can be reduced.

This embodiment can be implemented in combination with any of the aforementioned embodiments, as appropriate.

This application is based on Japanese Patent Application serial no. 2009-075824 filed with Japan Patent Office on Mar. 26, in 2009, the entire contents of which are hereby incorporated by reference.

What is claimed is:

1. A method for manufacturing a semiconductor substrate, comprising:
    performing carbonization treatment on a surface of a silicon substrate to form a silicon carbide layer;
    adding ions to the silicon substrate to form an embrittlement region in the silicon substrate;
    bonding the silicon substrate to a base substrate with an insulating layer interposed between the silicon substrate and the base substrate;
    heating the silicon substrate and separating the silicon substrate at the embrittlement region to form a stacked layer of the silicon carbide layer and a silicon layer over the base substrate with the insulating layer interposed between the base substrate and the stacked layer; and
    oxidizing the silicon layer to form a stacked layer of the silicon carbide layer and a silicon oxide layer.

2. The method for manufacturing the semiconductor substrate according to claim 1, wherein the insulating layer comprises a plurality of insulating layers.

3. The method for manufacturing the semiconductor substrate according to claim 1, wherein the carbonization treatment contains any of heat treatment or laser light irradiation treatment under a carbon-containing atmosphere, heat treatment or laser light irradiation treatment after a thin film containing carbon is formed on the surface of the silicon substrate, or heat treatment or laser light irradiation treatment after liquid containing carbon is applied on the surface of the silicon substrate.

4. The method for manufacturing the semiconductor substrate according to claim 1, wherein a conductive layer is formed on the silicon carbide layer after the silicon carbide layer is formed and before the silicon substrate and the base substrate are bonded to each other.

5. A method for manufacturing a semiconductor substrate, comprising:
- performing carbonization treatment on a surface of a silicon substrate to form a silicon carbide layer;
- adding ions to the silicon substrate to form an embrittlement region in the silicon substrate;
- bonding the silicon substrate to a base substrate with insulating layers interposed between the silicon substrate and the base substrate;
- heating the silicon substrate and separating the silicon substrate at the embrittlement region to form a stacked layer of the silicon carbide layer and a silicon layer over the base substrate with the insulating layers interposed between the base substrate and the stacked layer;
- oxidizing the silicon layer to form a silicon oxide layer; and
- thinning the silicon oxide layer to form a stacked layer of the silicon carbide layer and a thinned silicon oxide layer.

6. The method for manufacturing the semiconductor substrate according to claim 5, wherein the carbonization treatment contains any of heat treatment or laser light irradiation treatment under a carbon-containing atmosphere, heat treatment or laser light irradiation treatment after a thin film containing carbon is formed on the surface of the silicon substrate, or heat treatment or laser light irradiation treatment after liquid containing carbon is applied on the surface of the silicon substrate.

7. The method for manufacturing the semiconductor substrate according to claim 5, wherein a conductive layer is formed on the silicon carbide layer after the silicon carbide layer is formed and before the silicon substrate and the base substrate are bonded to each other.

8. A method for manufacturing a semiconductor substrate, comprising:
- performing carbonization treatment on a surface of a silicon substrate to form a silicon carbide layer;
- adding ions to the silicon substrate to form an embrittlement region in the silicon substrate;
- bonding the silicon substrate to a base substrate with insulating layers interposed between the silicon substrate and the base substrate;
- heating the silicon substrate and separating the silicon substrate at the embrittlement region to form a stacked layer of the silicon carbide layer and a silicon layer over the base substrate with the insulating layers interposed between the base substrate and the stacked layer;
- thinning the silicon layer to form a thinned silicon layer; and
- oxidizing the thinned silicon layer to form a stacked layer of the silicon carbide layer and a thinned silicon oxide layer after thinning the silicon layer.

9. The method for manufacturing the semiconductor substrate according to claim 8, wherein the carbonization treatment contains any of heat treatment or laser light irradiation treatment under a carbon-containing atmosphere, heat treatment or laser light irradiation treatment after a thin film containing carbon is formed on the surface of the silicon substrate, or heat treatment or laser light irradiation treatment after liquid containing carbon is applied on the surface of the silicon substrate.

10. The method for manufacturing the semiconductor substrate according to claim 8, wherein a conductive layer is formed on the silicon carbide layer after the silicon carbide layer is formed and before the silicon substrate and the base substrate are bonded to each other.

\* \* \* \* \*